United States Patent
Shirlin et al.

(10) Patent No.: US 6,946,628 B2
(45) Date of Patent: Sep. 20, 2005

(54) HEATING ELEMENTS DEPOSITED ON A SUBSTRATE AND RELATED METHOD

(75) Inventors: Jack W. Shirlin, Garden City, MI (US); Robert T. Kaiser, Westland, MI (US); James W. Proscia, Dearborn, MI (US)

(73) Assignee: Klai Enterprises, Inc., Wayne, MI (US)

( * ) Notice: Subject to any disclaimer, the term of this patent is extended or adjusted under 35 U.S.C. 154(b) by 0 days.

(21) Appl. No.: 10/658,657

(22) Filed: Sep. 9, 2003

(65) Prior Publication Data

US 2005/0051536 A1 Mar. 10, 2005

(51) Int. Cl.$^7$ .................................................. H05B 3/16
(52) U.S. Cl. ........................ 219/543; 219/549; 219/552
(58) Field of Search .............................. 219/528, 543, 219/549, 553, 552; 338/306, 307, 308, 309; 29/611, 620, 621; 252/600, 502

(56) References Cited

U.S. PATENT DOCUMENTS

| | | |
|---|---|---|
| 3,700,754 A | 10/1972 | Schmitt et al. |
| 3,953,643 A | 4/1976 | Cheung et al. |
| 3,968,056 A | 7/1976 | Bolon et al. |
| 3,988,647 A | 10/1976 | Bolon et al. |
| 4,049,844 A | 9/1977 | Bolon et al. |
| 4,088,801 A | 5/1978 | Bolon et al. |
| 4,113,894 A | 9/1978 | Koch, II |
| 4,187,340 A | 2/1980 | Oishi et al. |
| 4,188,449 A | 2/1980 | Lu et al. |
| 4,196,338 A * | 4/1980 | Edel ........................... 219/203 |
| RE30,274 E | 5/1980 | Bolon et al. |
| 4,256,591 A | 3/1981 | Yamamoto et al. |
| 4,271,212 A | 6/1981 | Stengle |
| 4,338,376 A | 7/1982 | Kritzler |
| 4,391,858 A | 7/1983 | Batzill |
| RE31,411 E * | 10/1983 | Bolon et al. ........... 112/470.12 |
| 4,420,500 A | 12/1983 | Nakatani et al. |
| 4,423,308 A | 12/1983 | Callaway et al. |
| 4,439,494 A | 3/1984 | Olson |
| 4,443,495 A * | 4/1984 | Morgan et al. ................ 427/96 |

(Continued)

FOREIGN PATENT DOCUMENTS

| | | |
|---|---|---|
| DE | 198 35 917 A1 | 2/2000 |
| EP | 0 081 323 A1 | 6/1983 |
| EP | 0 530 141 A1 | 3/1993 |
| EP | 0 567 940 A1 | 11/1993 |
| EP | 0 711 801 A2 | 5/1996 |
| EP | 0 820 217 A1 | 1/1998 |
| GB | 1 550 382 | 8/1979 |
| JP | 61203108 A | 9/1985 |
| JP | 4267097 A | 9/1992 |
| JP | 5279436 A | 10/1993 |
| JP | 5311103 A | 11/1993 |
| JP | 6016721 A | 1/1994 |
| WO | WO 97/31051 | 8/1997 |
| WO | WO 97/45458 | 12/1997 |
| WO | WO 98/50317 | 11/1998 |
| WO | WO 98/47954 | 10/1999 |
| WO | WO 00/62586 | 10/2000 |

*Primary Examiner*—Robin O. Evans
*Assistant Examiner*—Leonid Fastovsky
(74) *Attorney, Agent, or Firm*—Brooks Kushman P.C.

(57) ABSTRACT

A method for making a heating element adhered to a substrate by applying a photocurable composition to a flexible substrate in a pattern having one or more grid lines is provided. The photocurable composition is curable into an electrically conductive layer and volatile organic compounds are present in an amount of less than about 10% total weight of the photocurable composition. After the pattern is deposited on the substrate is cured by illuminating the photocurable composition with light for a sufficient period of time to cure the photocurable composition. Heating elements made by the method are also provided.

12 Claims, 4 Drawing Sheets

U.S. PATENT DOCUMENTS

| | | | |
|---|---|---|---|
| 4,455,205 A | 6/1984 | Olson et al. | |
| 4,478,876 A | 10/1984 | Chung | |
| 4,479,860 A | 10/1984 | Hayase et al. | |
| 4,495,042 A | 1/1985 | Hayase et al. | |
| 4,496,475 A | 1/1985 | Abrams | |
| 4,513,023 A | 4/1985 | Wary | |
| 4,533,445 A | 8/1985 | Orio | |
| 4,534,886 A * | 8/1985 | Kraus et al. | 252/502 |
| 4,539,258 A | 9/1985 | Panush | |
| 4,547,410 A | 10/1985 | Panush et al. | |
| 4,551,361 A | 11/1985 | Burzynski et al. | |
| 4,557,975 A | 12/1985 | Moore | |
| 4,594,315 A | 6/1986 | Shibue et al. | |
| 4,609,612 A | 9/1986 | Berner et al. | |
| 4,626,664 A | 12/1986 | Grise | |
| 4,640,981 A | 2/1987 | Dery et al. | |
| 4,654,511 A | 3/1987 | Horsma et al. | |
| 4,656,339 A | 4/1987 | Grise | |
| 4,665,342 A | 5/1987 | Topp et al. | |
| 4,666,821 A | 5/1987 | Hein et al. | |
| 4,684,353 A | 8/1987 | deSouza | |
| 4,738,899 A | 4/1988 | Bluestein et al. | |
| 4,749,844 A | 6/1988 | Grise | |
| 4,774,397 A * | 9/1988 | Grise | 219/549 |
| 4,788,108 A | 11/1988 | Saunders, Jr. et al. | |
| 4,806,257 A | 2/1989 | Clark et al. | |
| 4,809,428 A * | 3/1989 | Aden et al. | 29/611 |
| 4,814,208 A | 3/1989 | Miyazaki et al. | |
| 4,816,717 A | 3/1989 | Harper et al. | |
| 4,822,646 A | 4/1989 | Clark et al. | |
| 4,828,758 A | 5/1989 | Gillberg-Laforce et al. | |
| 4,849,255 A | 7/1989 | Grise et al. | |
| 4,877,512 A | 10/1989 | Bowns et al. | |
| 4,900,763 A | 2/1990 | Kraushaar | |
| 4,911,796 A | 3/1990 | Reed | |
| 4,959,178 A | 9/1990 | Frentzel et al. | |
| 4,960,614 A | 10/1990 | Durand | |
| 4,964,948 A | 10/1990 | Reed | |
| 4,975,471 A | 12/1990 | Hayase et al. | |
| 4,999,136 A * | 3/1991 | Su et al. | 252/512 |
| 5,006,397 A | 4/1991 | Durand | |
| 5,049,480 A | 9/1991 | Nebe et al. | |
| 5,068,714 A | 11/1991 | Seipler | |
| 5,076,963 A | 12/1991 | Kameyama et al. | |
| 5,100,848 A | 3/1992 | Enomoto et al. | |
| 5,104,929 A | 4/1992 | Bilkadi | |
| 5,116,639 A | 5/1992 | Kolk et al. | |
| 5,128,387 A | 7/1992 | Shustack | |
| 5,128,391 A | 7/1992 | Shustack | |
| 5,149,971 A | 9/1992 | McElhaney et al. | |
| 5,180,523 A | 1/1993 | Durand et al. | |
| 5,180,757 A | 1/1993 | Lucey | |
| 5,183,831 A | 2/1993 | Bielat et al. | |
| 5,221,560 A | 6/1993 | Perkins et al. | |
| 5,225,170 A | 7/1993 | Kolk et al. | |
| 5,229,582 A | 7/1993 | Graham | |
| 5,282,985 A | 2/1994 | Zabinski et al. | |
| 5,296,295 A | 3/1994 | Perkins et al. | |
| 5,326,636 A | 7/1994 | Durand et al. | |
| 5,356,545 A | 10/1994 | Wayte | |
| 5,384,160 A | 1/1995 | Frazzitta | |
| 5,384,238 A * | 1/1995 | Ellis et al. | 430/617 |
| 5,395,876 A | 3/1995 | Frentzel et al. | |
| 5,424,182 A | 6/1995 | Marginean, Sr. et al. | |
| 5,436,429 A | 7/1995 | Cline | |
| 5,453,451 A | 9/1995 | Sokol | |
| 5,454,892 A | 10/1995 | Kardon et al. | |
| 5,458,628 A | 10/1995 | Cipolla | |
| 5,462,701 A | 10/1995 | Hagemeyer et al. | |
| 5,470,643 A | 11/1995 | Dorfman | |
| 5,470,897 A | 11/1995 | Meixner et al. | |
| 5,514,214 A | 5/1996 | Joel et al. | |
| 5,523,143 A | 6/1996 | Hagemeyer et al. | |
| 5,556,527 A | 9/1996 | Igarashi et al. | |
| 5,561,730 A | 10/1996 | Lochkovic et al. | |
| 5,565,126 A | 10/1996 | Kimura et al. | |
| 5,587,433 A | 12/1996 | Boeckeler | |
| 5,596,024 A | 1/1997 | Horie et al. | |
| 5,609,918 A | 3/1997 | Yamaguchi et al. | |
| 5,624,486 A | 4/1997 | Schmid et al. | |
| 5,633,037 A | 5/1997 | Mayer | |
| 5,686,792 A | 11/1997 | Ensign, Jr. | |
| 5,698,310 A | 12/1997 | Nakamura et al. | |
| 5,716,551 A | 2/1998 | Unruh et al. | |
| 5,718,950 A | 2/1998 | Komatsu et al. | |
| 5,747,115 A | 5/1998 | Howell et al. | |
| 5,750,186 A | 5/1998 | Frazzitta | |
| 5,773,487 A | 6/1998 | Sokol | |
| 5,784,197 A | 7/1998 | Frey et al. | |
| 5,787,218 A | 7/1998 | Ohtaka et al. | |
| 5,824,996 A | 10/1998 | Kochman et al. | |
| 5,837,745 A | 11/1998 | Safta et al. | |
| 5,866,628 A | 2/1999 | Likavec et al. | |
| 5,871,827 A | 2/1999 | Jaffe et al. | |
| 5,883,148 A | 3/1999 | Lewandowski et al. | |
| 5,888,119 A | 3/1999 | Christianson et al. | |
| 5,914,162 A | 6/1999 | Bilkadi | |
| 5,942,284 A | 8/1999 | Hiskes et al. | |
| 5,945,502 A | 8/1999 | Hsieh et al. | |
| 5,950,808 A | 9/1999 | Tanabe et al. | |
| 5,968,996 A | 10/1999 | Sanchez et al. | |
| 5,994,424 A | 11/1999 | Safta et al. | |
| 6,006,136 A | 12/1999 | Glucksman | |
| 6,045,518 A | 4/2000 | Augustine | |
| 6,049,063 A | 4/2000 | Barber | |
| 6,054,501 A | 4/2000 | Taniguchi et al. | |
| 6,165,386 A | 12/2000 | Endo et al. | |
| 6,194,692 B1 * | 2/2001 | Oberle | 219/543 |
| 6,211,262 B1 | 4/2001 | Mejiritski et al. | |
| 6,215,111 B1 | 4/2001 | Rock et al. | |
| 6,261,645 B1 | 7/2001 | Betz et al. | |
| 6,267,645 B1 | 7/2001 | Burga et al. | |
| 6,290,881 B1 | 9/2001 | Krohn | |
| 6,330,986 B1 | 12/2001 | Rutherford et al. | |
| 6,373,034 B1 | 4/2002 | Rock et al. | |
| 6,414,286 B2 | 7/2002 | Rock et al. | |
| 6,419,651 B1 | 7/2002 | Augustine | |
| 6,423,018 B1 | 7/2002 | Augustine | |
| 6,483,087 B2 * | 11/2002 | Gardner et al. | 219/545 |
| 6,501,055 B2 | 12/2002 | Rock et al. | |
| 6,512,203 B2 | 1/2003 | Jones et al. | |
| 6,512,210 B2 | 1/2003 | Tanaka et al. | |
| 6,713,000 B2 * | 3/2004 | Krohn | 252/600 |
| 6,716,893 B2 * | 4/2004 | Krohn | 522/92 |

\* cited by examiner

HEATING ELEMENTS DEPOSITED ON A SUBSTRATE AND RELATED METHOD

FIELD OF THE INVENTION

The present invention relates to heating elements and to methods of making heating elements on a substrate using photocurable compositions, and in particular to heating elements and methods of making heating elements adhered to flexible substrates that are sensitive to volatile organic compounds.

BACKGROUND ART

The applications of flexible heating elements are ubiquitous and includes such applications as heating pads, cup warmers, and food warmers. Flexible heating elements are typically made from a grid network of wire embedded in an electrically insulating fire resistance matrix that protects the end user from electrical shock and does not ignite when the heating element is used.

Various designs exist for forming heating elements in which a grid pattern is deposited on a flexible substrate. In one type of design electrically conductive patterns are deposited on a substrate from a liquid composition that is cured to produce the conductive pattern. However, these liquid compositions typically contain volatile organic compounds ("VOCs") that are undesirable for a number of health and environmental reasons. For example, VOCs escape into the atmosphere resulting in water and air pollution. The cost of complying with strict government regulation on solvent emission levels is high. Moreover, the presence of VOCs in these liquid compositions severely limits the materials that can be used as substrates. For example, many types of polymeric substrates dissolve or are marred by VOCs. More importantly, many of the prior art liquid compositions do not produce conductive patterns that can withstand severe flexing that is desirable in flexible heating elements.

Generally, liquid compositions may be cured either by heating or by exposure to actinic radiation (i.e., UV light). Heat curable liquid in particular may be utilized to form electrically conductive coatings. However, such compositions almost always contain VOCs. Heat curable compositions also present other disadvantages such as slow cure times which lead to decreased productivity. Moreover, heat curable compositions require high energy for curing due to energy loss as well as the energy required to heat the coating. In addition to the limitations on substrate selection imposed by the VOCs, the need to heat cure limits substrates to materials that are heat tolerant at the curing temperatures.

Ultraviolet ("UV") curable compositions may also be used to form electrically conductive coatings. Many UV curable compositions in the prior art also contain significant amounts of VOCs. Moreover, UV compositions tend to have high molecular weights and a substantial degree of cross linkage due to the highly reactive nature of the composition. As a result, many of these compositions suffer from low durability and resin shrinkage. With the use of many such compositions, an inordinately high amount of UV light is required to cure. New formulations that lessen these problems typically suffer from diminished abrasion, chemical, and scratch resistance as well as low thermal stability and adhesion. An additional disadvantage of typical UV compositions is their lack of stability which results in dispersion. With some compositions, suspended solids fall out of solution after a period of one to two days. Dispersion adversely affects the gloss and clarity of the finished product. To combat this problem, new compositions have been formulated with higher viscosities which often lessen the flowability of the composition. These viscous formulations rule out spray application and provide for an unsuitably high dipping thickness.

Accordingly, there exists a need for improved processes of forming heating elements on a substrate; and in particular for improved processes of forming heating elements on substrates that are flexible and/or damaged by VOCs.

SUMMARY OF THE INVENTION

The present invention overcomes the problems encountered in the prior art by providing in one embodiment a method for depositing heating elements on a substrate. The method of the invention comprises applying a photocurable composition to a substrate in a pattern having one or more grid lines. The photocurable composition is curable into an electrically conductive layer. Moreover, volatile organic compounds are present in the photocurable composition in an amount of less than about 10% of the total weight of the photocurable composition. After the photocurable composition is applied to the substrate, it is illuminated with light for a sufficient period of time to cure the photocurable composition that has been applied to the substrate. The method of the present invention is advantageously used to form a heating element on flexible substrates which typically contain plastics that are at least partially soluble in volatile organic compounds or softened by volatile organic compounds. Such substrates are not amenable to composition that are thermally cured and may be degraded by compositions that contain solvents and other volatile organic compounds.

In another embodiment of the present invention a heating element deposited on a flexible substrate by the methods of the invention is provided.

DETAILED DESCRIPTION OF THE PREFERRED EMBODIMENT(S)

Reference will now be made in detail to presently preferred compositions or embodiments and methods of the invention, which constitute the best modes of practicing the invention presently known to the inventors.

Figure 1:
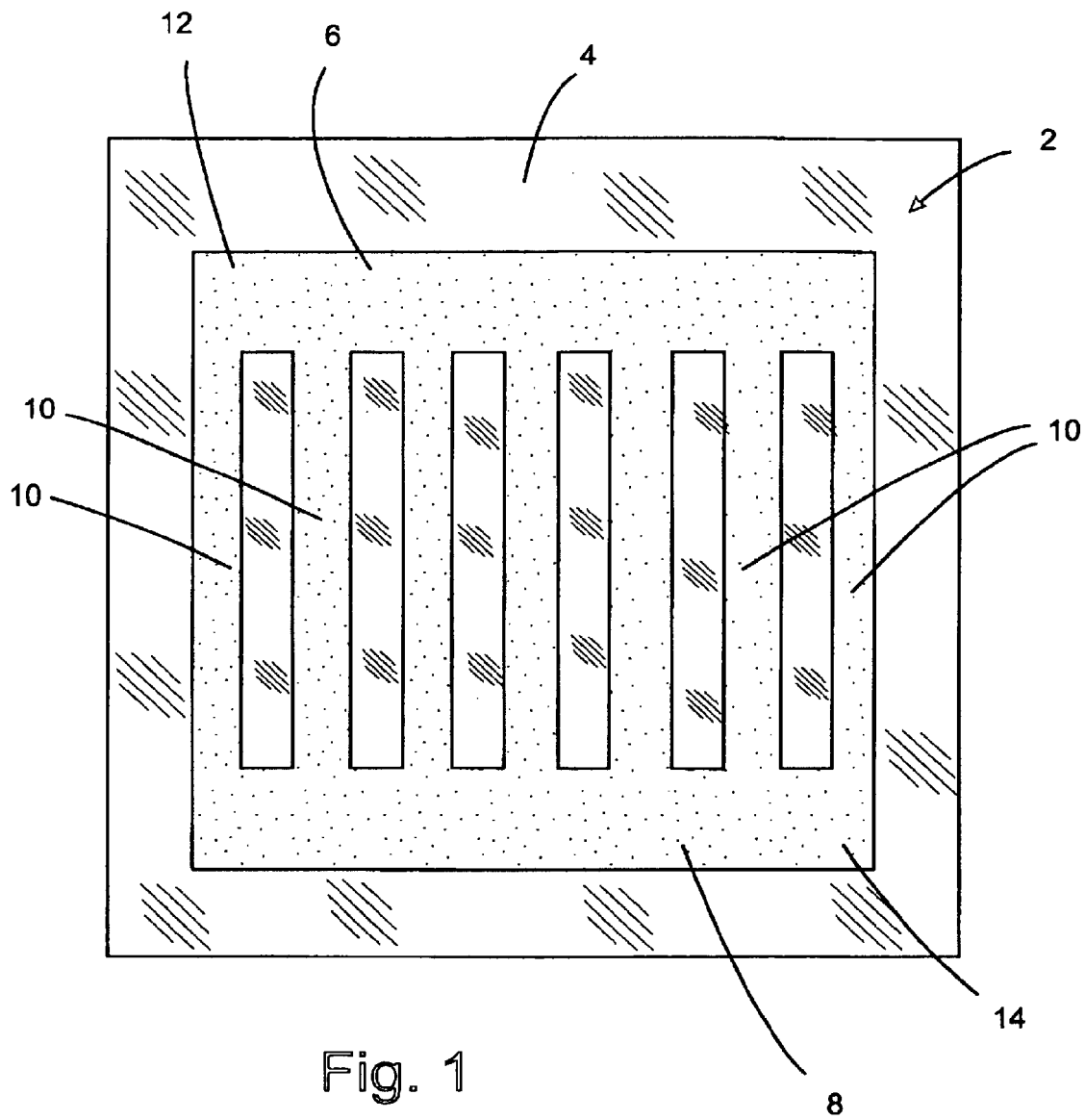
FIG. 1 is a top view of a heating element made by the method of the present invention having two busbars.
Figure 2:
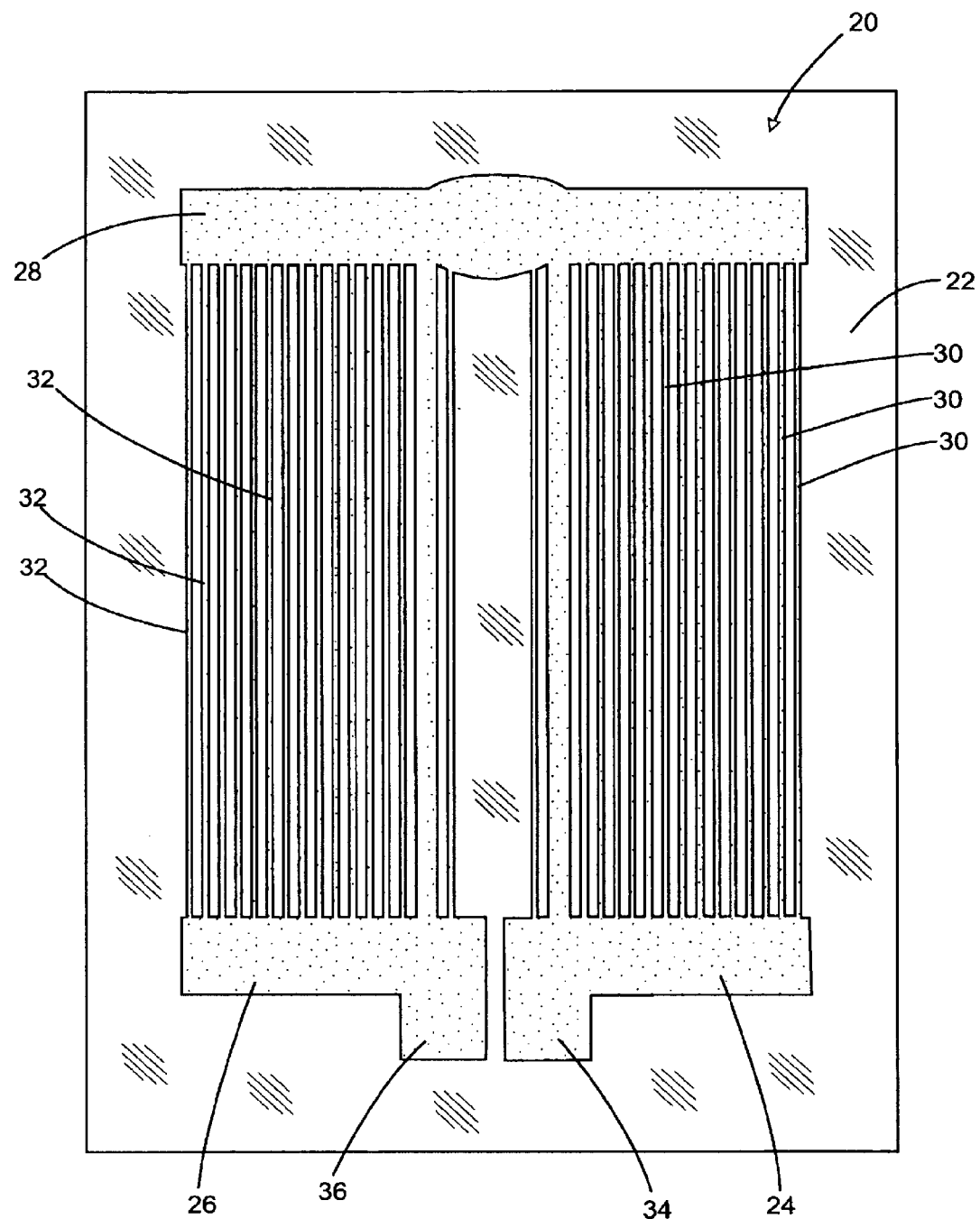
FIG. 2 is a top view of a heating element made by the method of the present invention having three busbars.

In an embodiment of the present invention, a method for making a heating element adhered to a substrate is provided. The heating element made by the method of the invention will be in a pattern that includes one or more gridlines. Moreover, this pattern will further include one or more busbars from which the one or more gridlines extend. As used herein, heating element refers to the combination of the gridlines and busbars. More preferably, the pattern comprises a first busbar and a second busbar wherein the one or more gridlines extend between and are in electrical contact with the first busbar and the second busbar. With reference to FIG. 1 a top view of a heating element made by the method of the invention is illustrated. Heating element 2 which is deposited on thin plastic substrate 4 includes busbars 6, 8. Gridlines 10 extend between busbars 6 and 8. A voltage is applied between positions 12 and 14 thereby causing gridlines 10 to resistively heat. The actual amount of heating will in part be determined by the magnitude of the applied voltage and the electrical resistance between positions 12 and 14. With reference to FIG. 2, a top view of another heating element with three busbars is provided. Heating element 20 which is deposited on thin plastic substrate 22 includes busbars 24, 26, 28. Gridlines 30 extend between busbars 24 and 29. Gridlines 32 extend between busbars 26 and 28. A voltage is applied between positions 34 and 36 thereby causing gridlines 30 and 32 to resistively heat. Flexible heating elements having the general form of FIG. 2 are made by screen printing UVAG 0010 on polyester substrates or on non-woven fabrics over-coated with polyethylene. In this latter example, the photocurable composition is applied to the coated side. UVAG 0010 is commercially available from Allied PhotoChemical located in Kimble, Mich.

Figure 3:
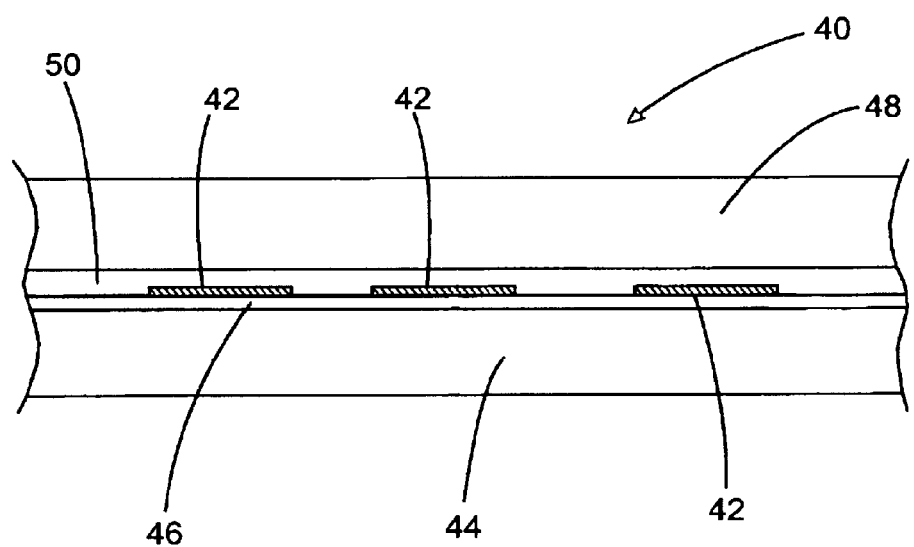
FIG. 3 is a cross section of a multilayer structure which incorporates a heating element made by the method of the invention.
Figure 4:
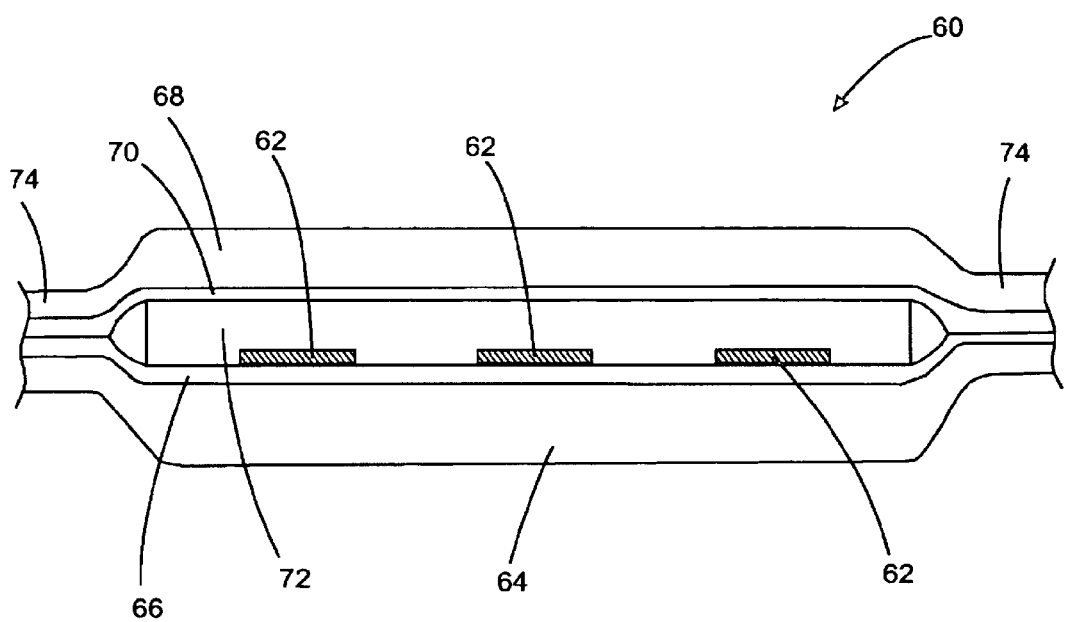
FIG. 4 is a cross section of a refinement of the invention in which a thermally insulating layer is incorporated in a multilayer structure which includes a heating element made by the method of the invention.

With reference to FIG. 3, a cross section of a multilayer structure which incorporates a heating element made by the method of the invention is provided. In this variation, heating element 40 includes gridlines 42 and busbars (not shown) which have been deposited on substrate 44 by the method of the invention. Suitable substrates include leather, cloth, foil, rigid or flexible plastics, polyester, polypropylene, polyethylene, PVC, metals, glass, paper, vinyl, wood, foam products, fiberglass, ABS, Kevlar, Lexan, scrim, woven and non-woven fabrics, rubber, cement, painted surfaces, and the like. Preferably, substrate 44 is a woven or non-woven fabric. Substrate 44 is optionally overcoated by optional coating 46 which is a preferably a plastic such as polyethylene or polypropylene. The combination of substrate 44 and gridlines 42 and the busbars are then attached to layer 48 which optionally includes coating 50 which again is preferably a plastic such as polyethylene or polypropylene. Moreover, layer 48 may be leather, cloth, foil, rigid or flexible plastics, polyester, polypropylene, polyethylene, PVC, metals, glass, paper, vinyl, wood, foam products, fiberglass, ABS, Kevlar, Lexan, scrim, woven and non-woven fabrics, rubber, cement, painted surfaces, and the like. Preferably, layer 48 is a woven or non-woven fabric. Layer 48 may be laminated to substrate 44 with heat when one or both of substrate 44 and layer 48 are coated by a plastic coating. Alternatively, layer 48 may be attached to substrate 44 by any attaching methods. Examples include, for example, sonic welding, solvent welding, glueing, and the like. Moreover, attachment of layer 48 to substrate 44 may be at multiple locations at the interface between layer 48 and substrate 44 or along edge 50 (periphery) of the overlap between layer 48 and substrate 44. With reference to FIG. 4, a cross section of a refinement of the invention in which a thermally insulating layer is incorporated in a multilayer structure which includes a heating element made by the method of the invention is provided. Heating element 60 includes gridlines 62 and busbars (not show) deposited on substrate 64 by the method of the invention. Suitable substrates include leather, cloth, foil, rigid or flexible plastics, polyester, polypropylene, polyethylene, PVC, metals, glass, paper, vinyl, wood, foam products, fiberglass, ABS, Kevlar, Lexan, scrim, woven and non-woven fabrics, rubber, cement, painted surfaces, and the like. Preferably, substrate 44 is a woven or non-woven fabric. Substrate 64 is optionally overcoated by optional coating 66 which is a preferably a plastic such as polyethylene or polypropylene. The combination of substrate 64 and gridlines 62 and the busbars are then attached to layer 68 which optionally includes coating 70 which again is preferably a plastic such as polyethylene or polypropylene. Moreover, layer 68 may be leather, cloth, foil, rigid or flexible plastics, polyester, polypropylene, polyethylene, PVC, metals, glass, paper, vinyl, wood, foam products, fiberglass, ABS, Kevlar, Lexan, scrim, woven and non-woven fabrics, rubber, cement, painted surfaces, and the like. Preferably, layer 68 is a woven or non-woven fabric. Insulating layer 72 is interposed between layer 68 and the combination of substrate 64 and gridlines 62. Layer 68 may be made of any thermally insulating material. An example is Thinsilate™ commercially available from 3M Company. Layer 68 and the combination of substrate 64 and gridlines 62 are attached together along edge 74 in the same manner as set forth above for FIG. 3.

The heating elements of the present invention are made by the method comprising applying a photocurable composition to a substrate in a pattern having one or more grid lines. The photocurable composition is curable into an electrically conductive layer and volatile organic compounds are present in the photocurable composition in an amount of less than about 10% of the total weight of the photocurable composition. More preferably, volatile organic compounds are present in the photocurable composition in an amount of less than about 5% of the total weight of the photocurable composition, and most preferably, volatile organic compounds are present in the photocurable composition in an amount of less than about 1% of the total weight of the photocurable composition. Unless stated otherwise, all percentages are weight percentages of the total weight of the photocurable composition. The resulting pattern on the substrate is illuminated for a sufficient period of time to cure the photocurable composition that has been applied to the substrate. Preferably, the substrate is a flexible substrate. Suitable substrates include leather, cloth, foil, rigid or flexible plastics, polyester, polypropylene, polyethylene, PVC, metals, glass, paper, vinyl, wood, foam products, fiberglass, ABS, Kevlar, Lexan, scrim, woven and non-woven fabrics, rubber, cement, painted surfaces, and the like. Moreover, many of the substrates may be over-coated with solvent sensitive materials such as polypropylene or polyethylene. Often the substrate will include a component that is at least partially soluble in volatile organic compounds or is softened by volatile organic compounds. Such sensitive substrates include rigid and flexible plastics, polyethylene, polypropylene, rubber, painted surfaces, and the like. Accordingly, it is important that the photocurable compositions used in the method of the present invention do not contain significant amounts of volatile organic compounds which damage such sensitive substrates.

The step of applying the photocurable composition to the substrate is accomplished by a number of techniques known to one skilled in the art. Such techniques include, for example, brushing, spraying dipping, flexographic techniques, and screen printing. Screen printing is preferred because it is easy to form patterns on substrates by screen printing. A sufficient amount of the photocurable composition is added so that the resulting heating element will draw from about 1 to 25 amps when a DC voltage from about 0.5 to about 36 volts is applied or when an AC voltage from about 110 to about 230 volts is applied.

Curing of the photocurable composition is effected by illumination with light which causes the composition to polymerize to form a coating. Preferably, the illumination is accomplished by ultraviolet light. Preferred ultraviolet radiation sources for a number of applications include known ultraviolet lighting equipment with energy intensity settings of, for example, 125 watts, 200 watts, and 300 watts per square inch.

The photocurable composition used in the method of the invention comprises a photocurable organic mixture, an electrically conductive composition, and a photoinitiator. The preferred photocurable compositions are the silver compositions and other electrically conductive compositions disclosed in U.S. Pat. No. 6,290,881, the entire disclosure of which is hereby incorporated by reference. The photocurable organic mixture typically contains one or more photocurable oligomers. Preferably, the one or more photocurable oligomers are selected from the group consisting of an aliphatic acrylated oligomers, acrylated epoxy oligomers, and mixtures thereof. More preferably, the photocurable organic mixture comprises an aliphatic acrylated urethane oligomers and an acrylated epoxy oligomers.

The photocurable organic mixture used in the method of the present invention preferably includes an aliphatic acrylated oligomer as set forth above. The aliphatic acrylated oligomer is present in an amount of about 3% to 8% of the total weight of the photocurable composition, and preferably about 8% of the total weight, of the photocurable composition. The aliphatic acrylated oligomer preferably comprises a urethane oligomer. Suitable aliphatic acrylated oligomers include Radcure Ebecryl 244, Ebecryl 264 and Ebecryl 284 urethanes, commercially available from Radcure UCB Corp. of Smyrna, Georgia; Sartomer CN961, CN963, CN964, CN 966, CN982 and CN 983, commercially available from Sartomer Corp. of Exton, Pa.; TAB FAIRAD 8010, 8179, 8205, 8210, 8216, 8264, M-E-15, UVU-316, commercially available from TAB Chemicals of Chicago, Ill.; and Echo Resin ALU-303, commercially available from Echo Resins of Versaille, Mo.; and Genomer 4652, commercially available from Rahn Radiation Curing of Aurora, Ill. The preferred aliphatic acrylated oligomers include Ebecryl 264 and Ebecryl 284. Ebecryl 264 is an aliphatic urethane triacrylate supplied as an 85% solution in hexandiol diacrylate. Ebecryl 284 is aliphatic urethane diacrylate of 1200 molecular weight diluted with 1,6-hexandiol diacrylate. It is obvious to one skilled in the art that combinations of these materials may also be employed herein.

The photocurable organic mixture used in the method of the present invention preferably further includes an acrylated epoxy oligomer. The acrylated epoxy oligomer is present in an amount of about 2% to 4% of the total weight of the photocurable composition, and preferably about 3% of the total weight of the photocurable composition. Suitable acrylated epoxy oligomers include Radcure Ebecryl 3603, commercially available from Radcure UCB Corp.; Sartomer CN120 and CN124, commercially available from Sartomer Corp.; and Echo Resin TME 9310 and 9345, commercially available from Echo Resins. The preferred acrylated epoxy oligomer is Ebecryl 3603, which tri-functional acrylated epoxy novolac. Combinations of these materials may also be employed herein.

The photocurable organic mixture used in the method of the present invention preferably includes includes an ethylenically unsaturated monomer having Formula I:

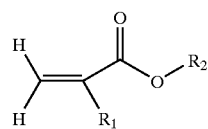

I wherein $R_1$ is hydrogen or substituted or unsubstituted alkyl; and $R_2$ is substituted or unsubstituted alkyl having more than 4 carbon atoms, cycloalkyl, cycloalkenyl, or substituted or unsubstituted aryl. Preferably $R_1$ is hydrogen or methyl; and $R_2$ is isobornyl, phenyl, benzyl, dicylcopentenyl, diclypentenyl oxyethyl, cyclohexyl, and naphthyl. The most preferred ethyleneically unsaturated monomers are isobornyl acrylate monomers. The isobornyl acrylate monomer is preferably present in an amount of about 4% to 8% of the total weight of the photocurable composition, and more preferably about 5% of the total weight of the photocurable composition. Suitable isobornyl acrylate monomers include Sartomer SR-423 (isobornyl methacrylate) and SR-506 (isobornyl acrylate) available from Sartomer Corp.; Radcure IBOA (isobornyl acrylate), commercially available from Radcure Corp.; IBOA and IBOMA, commercially available from CPS Chemical of Bradford, England; and Genomer 1121, commercially available from Rahn Radiation Curing. The preferred isobornyl acrylate monomer is Radcure IBOA, commercially available from Radcure Corp. Radcure IBOA is a high purity, low color monomer. Combinations of these materials may also be employed herein.

The preferred electrically conductive composition contained in the photocurable composition used in the method of the invention preferably comprises a component selected from the group consisting of silver, carbon black, doped metal oxides, metal nitrides, and mixtures thereof. These electrically conductive powders are most usefully used as powders or flakes. A suitable carbon black powder is Printex L commercially available from EM Industries of Hawthorne, N.Y. A suitable doped metal oxide is an antimony tin oxide powder such as Minatec 40 commercially available from EM Industries of Hawthorne, N.Y. Examples of metal nitrides include titanium nitride and vanadium nitride. Preferably, the electrically conductive composition comprises silver powder in an amount of about 20% to 60% of the total weight of the photocurable composition. More preferably, the electrically conductive composition comprises silver powder in an amount of about 50% to 60% of the total weight of the photocurable composition, and most preferably about 52% of the total weight of the photocurable composition. The silver powder comprises a plurality of particles. In this preferred photocurable composition, the silver powder has a particle size range for these particles of about 5 microns to about 15 microns. In some embodiments, the silver powder has a particle size range of about 4.7 microns to about 14.9 microns. Preferably, the silver powder particles have a particle size distribution wherein about 10% of the particles have a particle size of less than about 4.7 microns, about 50% of the particles have a particle size of less than about 7.6 microns, and about 90% of the particles have a particle size of less than about 14.9 microns. The preferred silver powders are Silver Powder EG-ED and Silver Powder C-ED commercially available from Degussa Corp. of South Plainfield, N.J.

The preferred electrically conductive composition further includes a silver flake composition. Preferably, the silver flake composition is present in an amount of about 15% to 40% of the total weight of the photocurable composition. More preferably, the silver flake composition is present in an amount of about 25% to 35% of the total weight of the photocurable composition, and most preferably about 30%, of the total photocurable composition. The silver flake composition comprises a plurality of flakes which comprise, and which preferably consist essentially of, silver. The silver flake composition according to this embodiment has a particle size range of about 5 microns to about 32 microns. More preferably, the silver flake composition has a particle size range of about 5.5 microns to about 32.0 microns. The silver flake particle size distribution preferably is such that about 10% of the particles have a particle size of less than about 5.5 microns, about 50% of the particles have a particle size of less than about 12.5 microns, and about 90% of the particles have a particle size of less than about 32.0 microns. The preferred silver flake compositions are Silver Flake #25, Silver Flake #1, and Silver Flake #7A commercially available from Degussa Corp. of South Plainfield, N.J.

This photocurable composition also includes a photoinitiator in an amount of about 3% to 6% of the total weight of the photocurable composition, and preferably about 4% of the total weight of the photocurable composition. Suitable photoinitiators include Irgacure 184 (1-hydroxycyclohexyl phenyl ketone), 907 (2-methyl-1-[4-(methylthio)phenyl]-2-morpholino propan-1-one), 369 (2-benzyl-2-N,N-dimethylamino-1-(4-morpholinophenyl)-1-butanone), 500 (the combination of 1-hydroxy cyclohexyl phenyl ketone and benzophenone), 651 (2,2-imethoxy-2-phenyl acetophenone), 1700 (the combination of bis(2, 6dimethoxybenzoyl-2,4-,4-trimethyl pentyl phosphine oxide and 2-hydroxy-2-methyl-1-phenyl-propan-1-one), Ciba-Geigy 1700, and DAROCUR 1173 (2-hydroxy-2-methyl-1-phenyl-1-propane) and 4265 (the combination of 2,4,6-trimethylbenzoyldiphenyl-phosphine oxide and 2-hydroxy-2-methyl-1-phenyl-propan-1-one), available commercially from Ciba-Geigy Corp., Tarrytown, N.Y.; CYRACURE UVI-6974 (mixed triaryl sulfonium hexafluoroantimonate salts) and UVI-6990 (mixed triaryl sulfonium hexafluorophosphate salts) available commercially from Union Carbide Chemicals and Plastics Co. Inc., Danbury, Conn.; and Genocure CQ, Genocure BOK, and GenocureMBF, commercially available from Rahn Radiation Curing. The preferred photoinitiator is Irgacure 1700 commercially available from Ciba-Geigy of Tarrytown, N.Y.

The photocurable composition optionally includes a flow promoting agent. Preferably the flow promoting agent is present in an amount of about 0.1% to 4% of the total weight of the photocurable composition, and preferably about 2.0% of the total weight of the photocurable composition. Suitable flow promoting agents are the same as those listed above. The preferred flow promoting agent is Modaflow which is an ethyl acrylate and 2-ethylhexyl acrylate copolymer that improves the flow of the composition.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for making a heating element adhered to a substrate, the method comprising:
   a) applying a photocurable composition to substrate in a pattern having one or more grid lines, the photocurable composition comprising
   an aliphatic acrylated urethane oligomer;
   acrylated epoxy oligomer;
   an isobornyl acrylate monomer;
   silver powder;
   silver flakes; and
   a photoinitiator, wherein the photocurable composition has less than about 10 weight % volatile organic compounds and wherein the substrate comprises a plastic that are at least partially soluble in volatile organic compounds or softened by volatile organic compounds; and
   b) illuminating the photocurable composition to light for a sufficient period of time to cure the photocurable composition that has been applied to the substrate.

2. The method of claim 1 wherein the silver flakes are present in an amount of at least 20% relative to the weight of the silver powder.

3. The method of claim 1 wherein,
   the aliphatic acrylated urethane oligomer is present in an amount of about 3% to 8% of the total weight of the photocurable composition;
   the acrylated epoxy oligomer is present in an amount of about 2% to 4% of the total weight of the photocurable composition; and
   the isobornyl acrylate monomer is present in an amount of about 4% to 8% of the total weight of the photocurable composition;
   the silver powder is present in an amount of about 50% to 60% of the total weight of the photocurable composition; and
   the silver flakes are present in an amount of about 25% to 35% of the total weight of the photocurable composition.

4. The method of claim 1 wherein the pattern further includes one or more busbars from which the one or more gridlines extend.

5. The method of claim 1 wherein the pattern comprises a first busbar and a second busbar wherein the one or more gridlines extend between and are in electrical contact with the first busbar and the second busbar.

6. The method of claim 1 wherein the substrate is a flexible substrate.

7. The method of claim 1 wherein the substrate is a flexible substrate.

8. The method of claim 1 wherein the photocurable composition comprises a component selected from the group consisting of silver, carbon black, a doped metal oxide, and mixtures thereof.

9. The method of claim 1 wherein the electrically conductive composition comprises silver powder and silver flakes in an amount of at least 20% relative to the weight of the silver powder.

10. The method in claim 1 wherein;
    a) the photocurable organic mixture comprises:
    an aliphatic acrylated urethane oligomer is present in an amount of about 3% to 8% of the total weight of the photocurable composition;
    acrylated epoxy oligomer is present in an amount of about 2% to 4% of the total weight of the photocurable composition;
    an isobornyl acrylate monomer is present in an amount of about 4% to 8% of the total weight of the photocurable composition;
    silver powder is present in an amount of about 50% to 60% of the total weight of the photocurable composition; and
    silver flakes are present in an amount of about 25% to 35% of the total weight of the photocurable composition.

11. The method of claim 1 wherein the photocurable composition further comprises a flow promoting agent.

12. The method of claim 1 wherein the electrical composition further includes a second conductive powder selected from the group consisting of carbon black and a doped metal oxide.

* * * * *